United States Patent
Pilo et al.

(10) Patent No.: US 6,504,766 B1
(45) Date of Patent: Jan. 7, 2003

(54) SYSTEM AND METHOD FOR EARLY WRITE TO MEMORY BY INJECTING SMALL VOLTAGE SIGNAL

(75) Inventors: Harold Pilo, Underhill, VT (US); John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/896,734

(22) Filed: Jun. 29, 2001

(51) Int. Cl.$^7$ .............................................. G11C 16/04
(52) U.S. Cl. .................... 365/189.01; 365/205; 365/207
(58) Field of Search ........................ 365/189.01, 189.04, 365/207, 203, 205, 191, 190

(56) References Cited

U.S. PATENT DOCUMENTS

| | | |
|---|---|---|
| 4,677,592 A | 6/1987 | Sakurai et al. |
| 5,007,022 A | 4/1991 | Leigh |
| 5,905,685 A * | 5/1999 | Nakamura et al. .......... 365/205 |
| 5,923,593 A | 7/1999 | Hsu et al. |
| 5,963,497 A | 10/1999 | Holland |
| 6,085,300 A | 7/2000 | Sunaga et al. |
| 6,246,614 B1 * | 6/2001 | Ooishi ........................ 365/191 |

FOREIGN PATENT DOCUMENTS

| | | |
|---|---|---|
| JP | 07-211068 | 8/1995 |
| JP | 11-086539 | 3/1999 |
| JP | 11-219585 | 8/1999 |

OTHER PUBLICATIONS

IBM Technical Disclosure Bulletin, "Early Restore of Column Address Strobe for Dense Random–Access Memories in Page Mode", vol. 28, No. 8, Jan. 1986, pp. 3540–3541.
IBM Technical Disclosure Bulletin, "Transparent Refresh of Dynamic Random–Access Memories", vol. 23, No. 7B, Dec. 1980, pp. 3201–3202.

* cited by examiner

Primary Examiner—David Nelms
Assistant Examiner—David Lam
(74) Attorney, Agent, or Firm—Daryl K. Neff

(57) ABSTRACT

A system and method is disclosed for writing early within a memory cycle by injecting a small voltage difference signal prior to setting a sense amplifier, and thereafter setting the sense amplifier which amplifies the small voltage signal to predetermined high and low voltage logic levels for writing to the memory cell. In this way, writing can complete in about the same time as reading, without risking corruption of data on adjacent bitlines in the memory. Local bitswitches apply first and second write voltages having a small voltage difference to a true bitline and a reference bitline prior to setting the sense amplifier.

22 Claims, 7 Drawing Sheets

SYSTEM AND METHOD FOR EARLY WRITE TO MEMORY BY INJECTING SMALL VOLTAGE SIGNAL

FIELD OF THE INVENTION

This invention relates to integrated circuit memories and more specifically to an integrated circuit memory, especially a dynamic random access memory (DRAM), in which stored contents are sensed from small voltage signals present on bitlines.

BACKGROUND

Existing DRAMs are generally slower to access than static random access memory (SRAM) or read only memory (ROM). Conventionally, DRAMs have been manufactured as standalone independent integrated circuit chips which store large quantities of data for faster access than magnetic or optical disk media, at relatively low prices and low power consumption. SRAMs and ROMs, by contrast, have usually provided faster access than DRAMs, but often at higher prices and power consumption because these memory types require a larger device count per stored data bit, which adds to cost and density.

Recently, interest has increased in using DRAMs as one of several elements of an integrated circuit, e.g. a "system on a chip", which may also include logic or linear circuits or other circuit types. Such DRAM elements have been called embedded DRAM or "EDRAM". The goals of using embedded DRAM include obtaining potentially large amounts of easily rewriteable storage with fast access times but at lower cost and power consumption than SRAMs. One problem facing existing DRAMs is that it takes longer to write a memory cell with a new datum than it takes to read or refresh the datum in that memory cell. This problem is understood with reference to FIGS. 1 and 2. Specifically, FIG. 1 shows signals which are active when a prior art DRAM memory cell is being read. A read operation begins with the wordline voltage 10 rising from a quiescent value (in this case, about −0.4 volts) to an activated value which makes the access transistor of the memory cell conduct. Charge stored by a capacitor in the memory cell then begins to flow through the transistor on a bitline to a sense amplifier. At the sense amplifier a small voltage difference signal 11 develops between the voltage 12 on a bitline BT and the voltage 14 on a reference bitline BC which is not connected to the memory cell being read. The sense amplifier functions to convert a small swing, e.g. "analog" signal between the bitline BT and the reference bitline BC into a full swing logic level signal for storage to or transfer of the datum from the memory cell. After the small voltage signal 11 appears, the sense amplifier is set, i.e. triggered through a signal SETP 16, to amplify the small voltage signal 11 to full swing logic levels. This results in the bitline voltage 12 and the reference bitline voltage 14 separating from their initial small voltage difference to respective predetermined high and predetermined low logic levels, in this case about 1.2 V, and 0.0 V, respectively. The voltage stored in the memory cell is shown in FIG. 1 by curve 18.

By contrast, some write operations in conventional DRAMs take longer to perform than a read operation. With reference to FIG. 2, an operation to write a high logic level, i.e. a "1" in a memory cell that currently stores a low logic level, i.e. a "0" is known as "Read_0_Modify_Write_1." This write operation starts by reading the memory cell which contains a "0" and then forcing the memory cell to store the opposite value "1." The initial reading step is necessary to prevent the stored contents of memory cells on adjacent bitlines from becoming corrupted. While the one memory cell is being rewritten with a "1" from a "0" state, memory cells on other bitlines accessed by the same wordline are read and "written back" with the same data that they already store.

As shown in FIG. 2, the read_modify_write operation begins the same way as the read operation with the wordline voltage 10 rising from the quiescent value to an activated value. Charge stored by a capacitor in the memory cell then begins to flow through the transistor on a bitline to a sense amplifier, where a small voltage difference signal 21 develops between the voltage 22 on a bitline BT and the voltage 20 on a reference bitline BC which is not connected to the memory cell being written. After the small voltage signal 21 appears, the signal SETP 16 sets the sense amplifier, which results in the small voltage signal 21 being amplified into predetermined high and predetermined low logic levels on the reference bitline BC and the bitline BT, respectively, which reflect the original "0" value datum stored in the memory cell.

In the prior art DRAM operation shown in FIG. 2, the voltages 22, 20 on the bitline BT and reference bitline BC are forced to new levels only after the sense amplifier is set. After the sense amplifier is set, the voltages 20, 22 advance almost fully towards the high and low logic levels, respectively. Then, the bitline and reference bitline voltages reverse course to reach the opposite levels as required by the write operation. The time required to perform the initial read before writing makes the voltage 24 in the memory cell take longer to rise than in the read operation. In comparison to the read operation shown in FIG. 1, in the read_modify_write operation, the memory cell voltage takes about 30% longer to rise to 90% of final value than it does in the read operation, as evident from comparing the intervals t0–t1 of FIG. 1 with t0'–t1' of FIG. 2.

Heretofore, the longer time to perform the read_modify_write operation has been considered acceptable. This is because forcing bitline signal levels to new values too soon could potentially corrupt data in other memory cells due to line to line noise coupling between the bitline being written and an adjacent bitline. Heretofore, there has not been a way to quickly write a memory cell with a new value without risking corruption of data in memory cells which are accessed by adjacent bitlines.

SUMMARY

Accordingly, among objects of the invention, each of which may operate in the alternative to, or in conjunction with other objects, are the following:

An object of the invention is to perform a write operation to a memory cell in about as little time as a read operation.

Another object of the invention is to quickly perform a write operation to a memory cell without risking corruption of data in memory cells accessed by adjacent bitlines.

Still another object of the invention is to perform a write operation by injecting a small voltage signal onto a bitline and a reference bitline and setting a sense amplifier to amplify the signal into predetermined high and low logic levels for storing into a memory cell.

Accordingly, in an aspect of the present invention, an integrated circuit including a memory is provided which is adapted to write a datum to a memory cell by local bitswitches which apply first and second write voltages having a small voltage difference to a true bitline and a reference bitline prior to a sense amplifier being set, the sense amplifier being adapted to amplify the small voltage difference to a predetermined high voltage and a predetermined low voltage, the true bitline having one of the predetermined high voltage and the predetermined low voltage, which is then written to the memory cell.

In a more preferred aspect of the invention, the memory cell being written and other memory cells are accessed by a wordline. Local bitswitches on such other memory cells not currently being written are adapted to isolate true and reference bitlines coupled to those memory cells prior to the setting of sense amplifiers coupled to those bitlines, such that the stored contents of such memory cells not being written are refreshed at the time that the selected memory cell is written.

DETAILED DESCRIPTION OF THE PREFERRED EMBODIMENTS

The present invention provides a system and method of writing a datum to a memory cell by applying a small voltage difference write signal to a true bitline and a reference bitline, i.e. complementary bitline, at a time prior to setting a sense amplifier, and then setting the sense amplifier to amplify the small voltage difference on the true and reference bitlines to a full swing signal being a predetermined high voltage on one of the true and reference bitlines and a predetermined low voltage on the other one. The memory cell is then written with the high voltage or the low voltage which is present on the true bitline.

By contrast, the reading of a memory cell is performed by activating a wordline and permitting a small voltage difference signal to develop on the true and reference bitlines from the charge stored within the memory cell, and then setting the sense amplifier to amplify the small voltage difference signal to a full swing signal being a predetermined high voltage on one of the true and reference bitlines and a predetermined low voltage on the other one.

Figure 1:
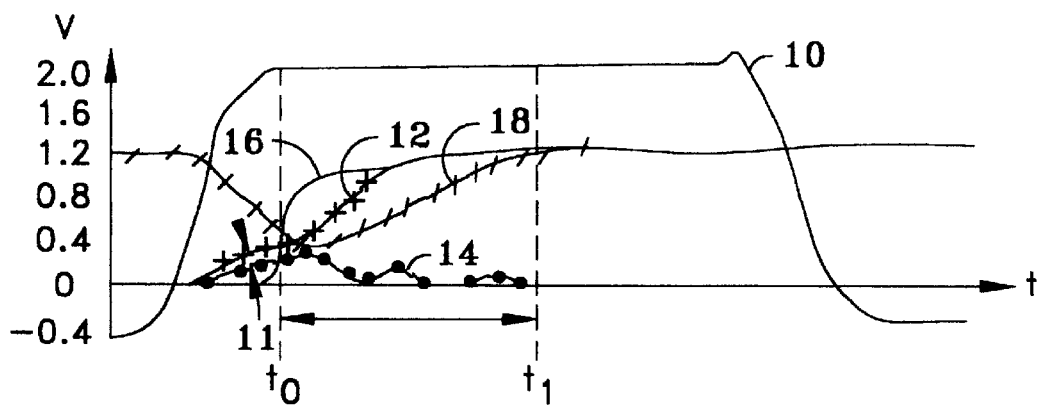
FIGS. 1 and 2 are timing diagrams illustrating read and read_modify_write operations, respectively.
Figure 2:
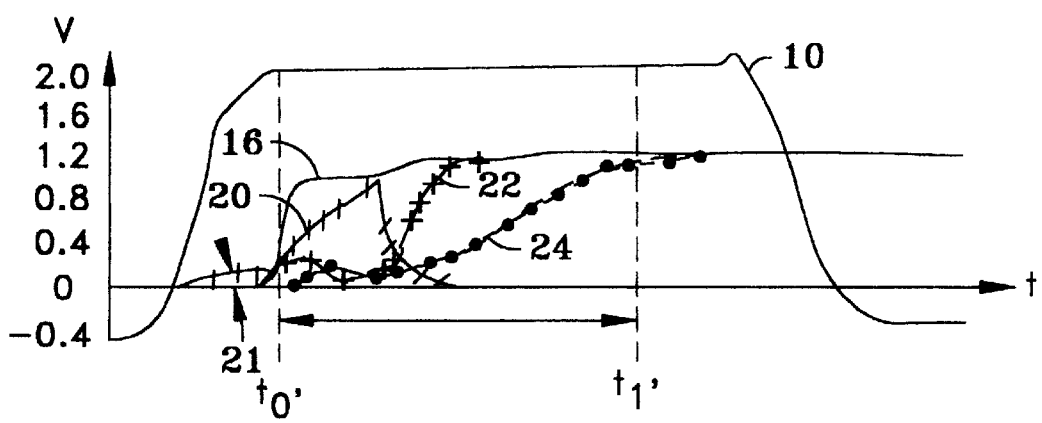
Figure 3:
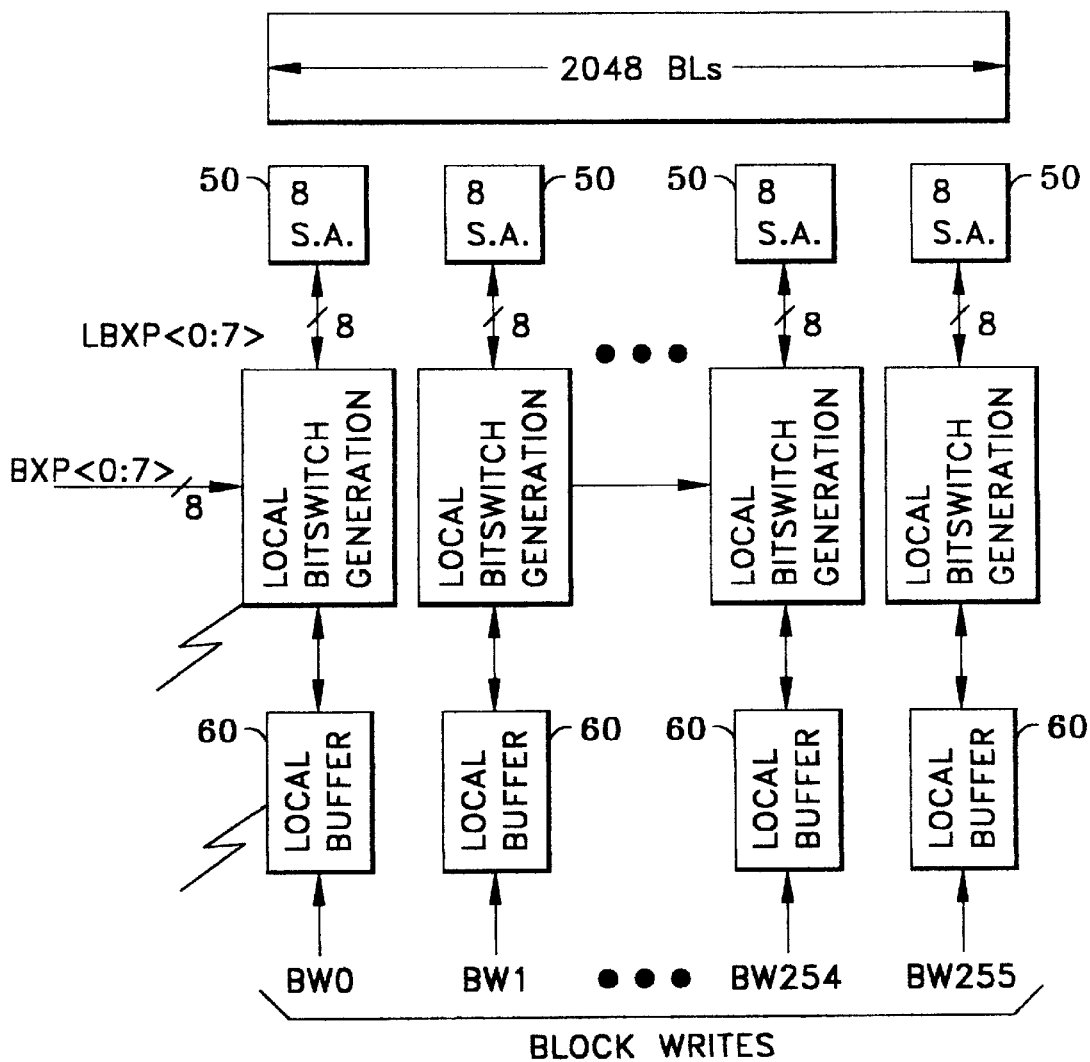
FIGS. 3–7 are block and schematic diagrams showing circuitry of an embodiment of the invention.

In the embodiment described below, a small voltage difference write signal is applied to the true and reference bitlines using bitswitches which are timed differently for write operations as they are for read operations. FIG. 3 is a block diagram of sensing circuitry associated with a memory array. With reference to FIG. 3, local bitswitches within each group 50, preferably implemented as NFETs, control the signal flow on the true and reference bitlines between a primary sense amplifier group 50 and a local buffer 60. Each local buffer 60 has one true fan node and one complement fan node which are coupled by eight pairs of local bitswitches to one of eight true bitlines and to one of eight reference bitlines in the group 50 of eight sense amplifiers, respectively. In each group of eight pairs of local bitswitches, one pair is turned on at a time by signals LBXP<0:7> to conduct signals between the true bitline and true fan node, and between the reference bitline and complement fan node.

According to the invention, in a write operation, prior to setting the sense amplifier, a small voltage difference signal having a desired polarity is applied to the true and complement fan nodes and the local bitswitch pair is turned on. This results in a small voltage difference signal being applied to the true and reference bitlines. The sense amplifier is then set, which amplifies that small voltage difference signal into predetermined high and predetermined low voltage logic levels, a different one of these levels to each of the true and reference bitlines. The high voltage level or the low voltage level which is present on the true bitline stores a datum to the memory cell, and the local bitswitch pair is then turned off again.

Figure 4:
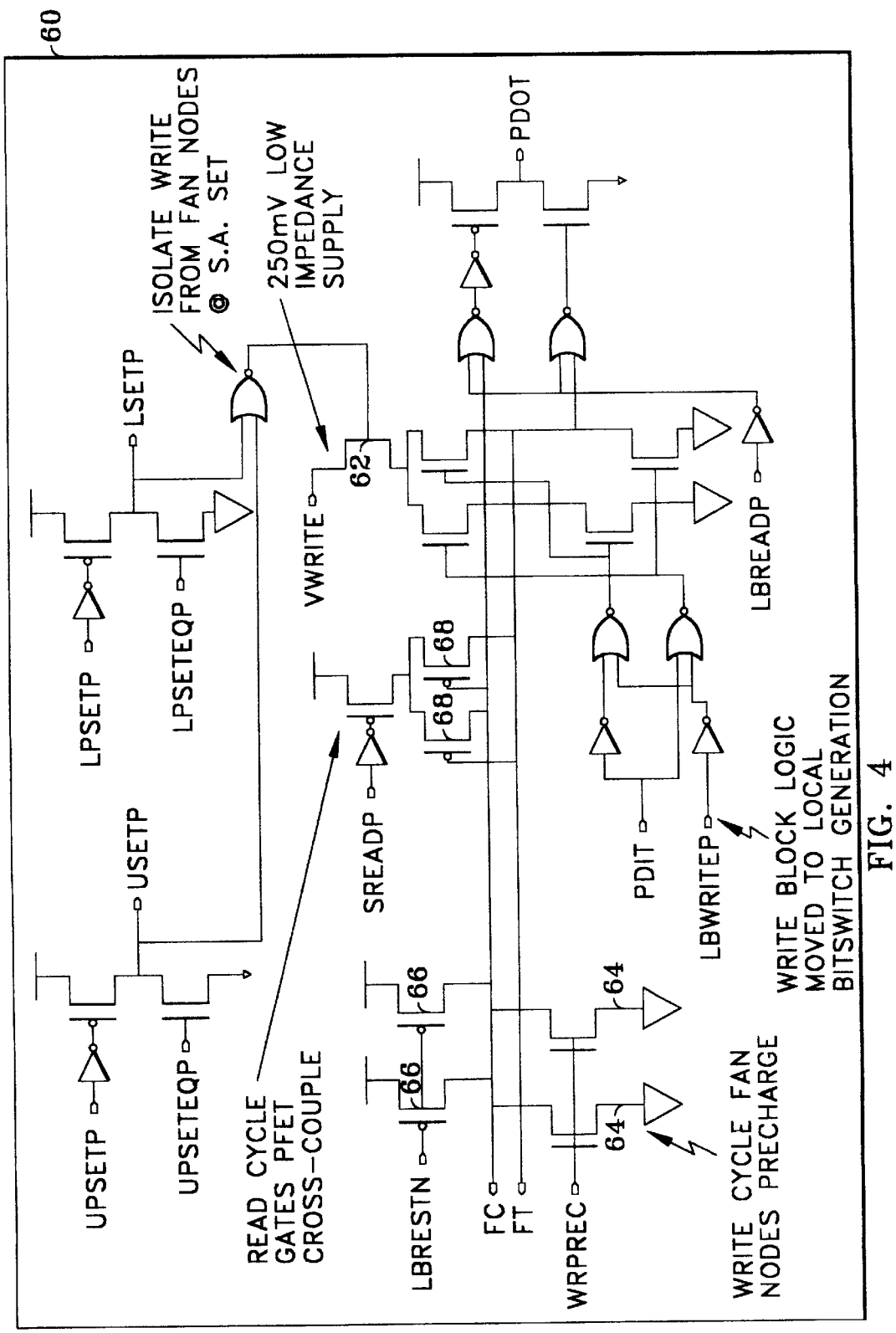

FIG. 4 is a schematic diagram of a local buffer 60 including true fan node FC and complement fan node FT. Local buffer 60 applies a small voltage difference write signal to the true and complement fan nodes FC and FT, the polarity of the signal determined by whether a "0" or a "1" is to be written to the memory cell. The logic circuitry of FIG. 6, which will be more fully explained below, controls bitswitch timing such that the local bitswitch pair is turned on and off with different timing for read and write operations.

The local buffer 60 provides for read data output at terminal PDOT, and for write data input at terminal PDIT. A global read signal LBREADP and associated circuitry manages signal output through PDOT. A global write signal LBWRITEP, active only during a write operation, causes a small voltage difference write signal to be applied to true and complement fan nodes FT and FC. Signals PDIT and LBWRITEP are input to logic circuits which apply a small voltage VWRITE to one of true fan node FT and complement fan node FC, as controlled by the binary value of PDIT, while the other one of true fan node FT and complement fan node FC is discharged to ground. VWRITE is a small voltage signal in relation to the high and low voltages that are used as full swing logic levels to output a datum read from the true and reference bitlines. The voltage VWRITE, referenced to ground, is comparatively close to the small voltage difference signal between true and reference bitlines which are input to a sense amplifier within group 50 from a memory cell, which the sense amplifier amplifies to full swing logic levels for readout. In an exemplary system in which full swing logic levels of 0.0 V and 1.2 V are used on true and reference bitlines, a small voltage difference signal is applied to true and reference bitlines by applying a VWRITE voltage of about 250 mV to one of them, and ground to the other.

Figure 5:
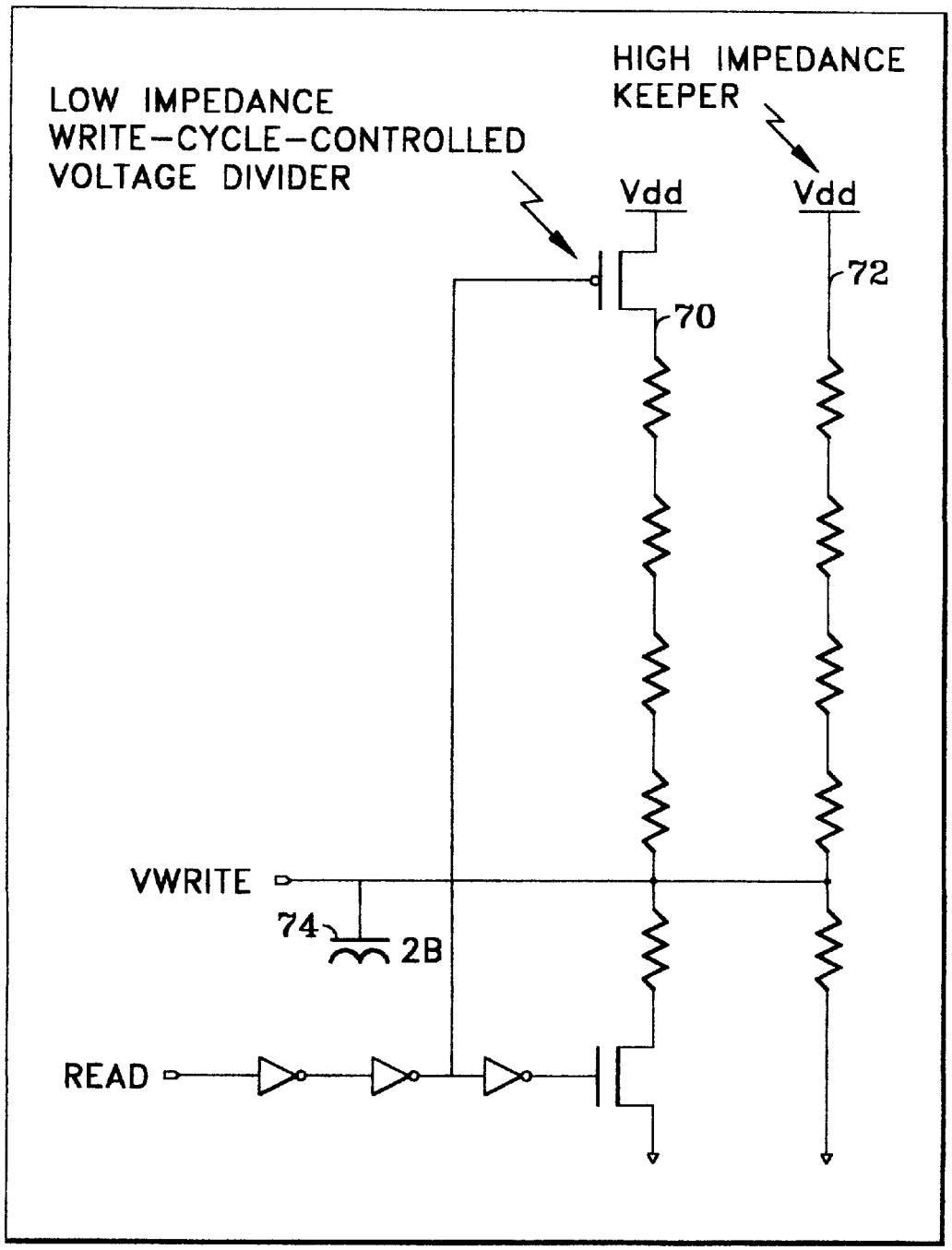

FIG. 5 shows an exemplary circuit used to generate and maintain a small voltage supply VWRITE. The circuit includes two voltage dividers 70 and 72. Voltage divider 70 is a low impedance divider which conducts only during a write operation, as controlled by the READ signal input through an inverter and associated switching logic. The low impedance divider 70 sources current during write operations. Voltage divider 72 has high impedance and is used to maintain the VWRITE voltage level in other than write operations. A capacitor 74 further assists in maintaining the voltage level and sourcing current when needed.

Referring again to FIG. 4, local buffer 60 receives global sense amplifier set signals for an upper array (UPSETP), and for a lower array (LPSETP), which are regenerated as local set sense amplifier signals USETP and LSETP, respectively. These local set sense amplifier signals are reset by global equalization signals UPSETEQP and LESETEQP, respectively. As evident in FIG. 4, the activation of either local set sense amplifier signal USETP or LSETP turns off a transistor 62, thus preventing the voltage VWRITE from being applied to either true fan node FT or its complement FC.

Write precharge devices 64 are provided and controlled separately from read precharge devices 66. For a write operation, fan nodes FT and FC are "precharged," i.e. discharged to ground, by devices 64 as timed by write precharge signal WRPREC. On the other hand, for a read operation, fan nodes FT and FC are precharged to a predetermined high voltage logic level Vdd by devices 66, as timed by read precharge signal LBRESTN. PFET devices 68, cross-coupled between fan nodes FC and FT, are activated by a signal SREADP only during a read operation. During the read operation, the cross-coupled devices 68 assist in regenerating and maintaining each of the predetermined high and low logic levels on the true and complement fan nodes FT and FC. The devices 68 are disabled during a write operation, since signal differentiation is desired to be performed only in primary sense amplifier of local group 50.

Figure 6:
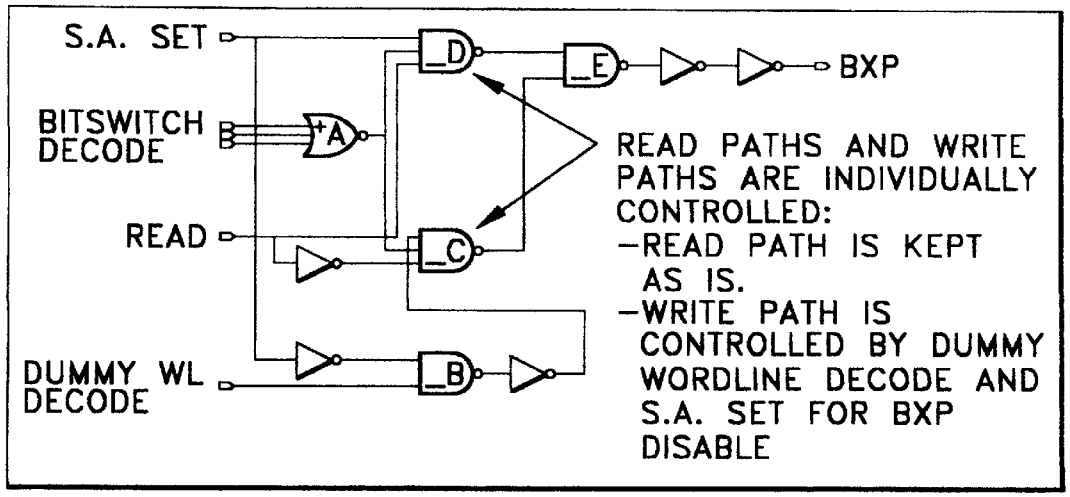

An exemplary circuit for generating global bitswitch on/off signals is shown in FIG. 6. This circuit times the activation of the global bitswitch signal differently for read and write operations. Referring again to FIG.3, the global bitswitch on/off signals BXP<0:7> are transferred to the local bitswitches as local bitswitch signals LBXP<0:7>, generated by logic circuitry shown in FIG. 7. As noted above, in a read operation, a local bitswitch pair is turned on when the sense amplifier is set and is turned off when the wordline is deactivated. By contrast, during a write operation, the local bitswitch pair is turned on earlier, at the time the wordline is activated, and is turned off again when the sense amplifier is set, long before the wordline is deactivated.

Referring to FIG. 6, one of eight global bitswitches BXP0:7 is selected by binary inputs to decoder gate A which goes high upon receiving the correct input combination. During a write operation, the selected global bitswitch goes high when the wordline is activated and goes low again when the sense amplifier is set. Throughout the write operation, the READ signal remains low causing gate D output to remain high. When the wordline is activated (as represented by the input "Dummy Wordline Decode" going high) and prior to the sense amplifier being set, both inputs to gate B are high, which force gate B output to low, gate C output to low in turn, and the outputs of gate E high and BXP high. The global bitswitch is then on. When the sense amplifier set signal is received, the output of gate B goes high, gate C goes high in turn, and the outputs of gate E and BXP go low again.

During a read operation, a selected global bitswitch goes high when the sense amplifier is set and goes low again when the sense amplifier is reset. In this operation, the READ signal is high. After the wordline is activated (as represented by "Dummy Wordline Decode" and prior to the sense amplifier being set, both inputs to gate B are high, and gate B goes low. Gate C goes high because READ is high and gate D is high because sense amplifier set is still low. Therefore, gate E is low and BXP is low in turn. After the sense amplifier set signal is received, gate B goes high, gate C stays high because READ is high, but gate D goes low because sense amplifier set is high. Thus, gate E goes high, which in turn drives global bitswitch signal BXP high. BXP falls low again when sense amplifier set falls low, driving gate D high and gate E low.

Figure 7:
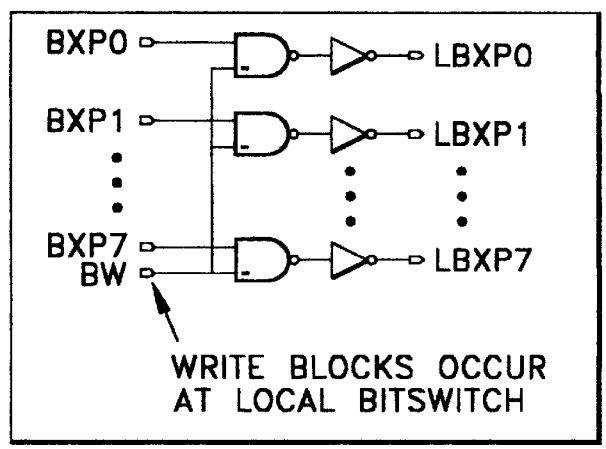

FIG. 7 shows logic circuitry which transfers global bitswitch signals to local bitswitches according to whether a particular block, i.e. sense amplifier group 50, is selected with a block write signal BW. As indicated in FIG. 3, block write signals BW0 ... BW255 are provided to respective ones of the groups 50. For example, a local bitswitch pair for the pair of true and reference bitlines numbered "1" in a group 50 is turned on by local bitswitch signal LBXP1 when an enabled block write signal BW and enabled global bitswitch signal BXP1 are present. During read operations, all block write signals BW remain enabled.

In operation, a write operation is performed in about the same amount of time as a read operation, without disturbing data stored in memory cells accessed by bitlines adjacent to the bitline where the write is performed. Referring to FIG. 4, a write operation begins with the following initial conditions: LSETP, USETP, SREADP, LBREADP all low, LBRESTN high. To prepare to write, the signal WRPREC causes devices 64 to discharge the true and complement fan nodes FT and FC to ground. Following precharge, write input PDIT and write control signal LBWRITEP are presented to local buffer 60. Based on whether PDIT is high or low, VWRITE is applied from low impedance divider 70 (FIG. 5) to one of the true and complement fan nodes FT and FC, while the other fan node is held at ground. For example, if PDIT is high, true fan node FT will be charged to the VWRITE voltage and complement fan node FC will be held at ground. Alternatively, if PDIT is low, complement fan node FC will be charged to VWRITE and true fan node FT will be held at ground.

In the meantime, a global bitswitch signal is being prepared by the circuitry of FIG. 6. Decoding occurs at gate A. One BXP signal of eight (BXP<0:7>) is enabled when the wordline is activated, as represented by receipt of the Dummy Wordline Decode signal at gate B. As shown in FIG. 7, that BXP, for example BXP1 is transferred to a local bitswitch pair as a local bitswitch signal LBXP1 wherever a block write BW for the group 50 is enabled. LBXP1 turns on the local bitswitches for true and reference bitlines numbered "1", and those true and reference bitlines are now connected to the true and complement fan nodes FT and FC, respectively.

The activated wordline within the memory array permits charge to flow from memory cells connected to the wordline onto true bitlines. At least one of the true bitlines now connects the true fan node FT through a conducting, true bitline to a memory cell for writing. The voltages on the conducting true and reference bitlines then approach the voltages present at the respective fan nodes. Thus, a small voltage difference write signal of about VWRITE referenced to ground has been applied between the true and reference bitlines. A set signal now sets the sense amplifier at group 50 which amplifies the small voltage difference write signal into full swing logic levels being a predetermined high voltage, for example 1.2 V and a predetermined low voltage, for example 0.0 V, on the true and reference bitlines, respectively. The set signal also turns off the local bitswitches by disabling the global bitswitch signals (FIG. 6), which isolates the primary sense amplifier of group 50 from the fan nodes FT and FC to permit the small voltage difference signal to be amplified to full swing logic levels.

While the wordline remains activated, the voltage at the memory cell rises or falls to a level close to that of the predetermined high or low voltage logic level that is now present on the true bitline. Thereafter the wordline is deactivated, thereby ending the write operation.

Figure 8:
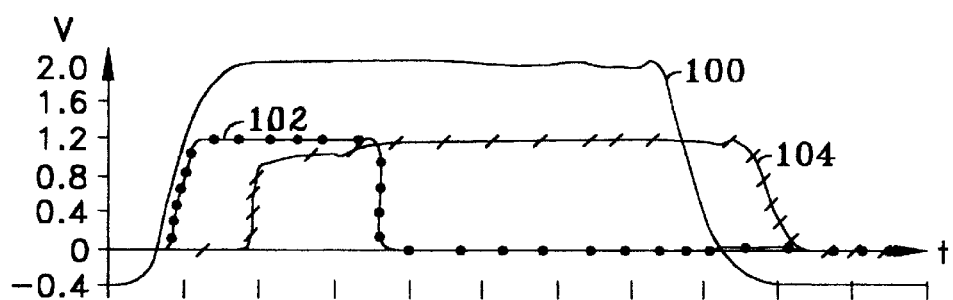
FIGS. 8–14 are timing diagrams illustrating write and read operations of the present invention.
Figure 9:
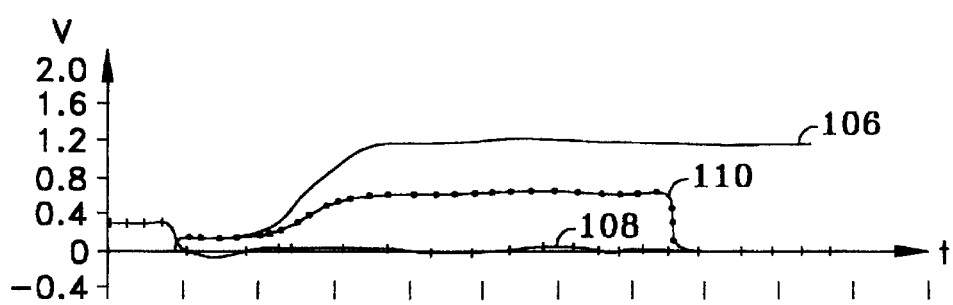
Figure 10:
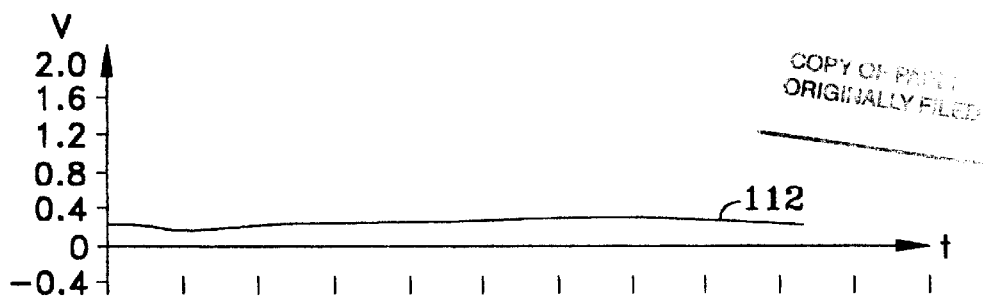
Figure 11:
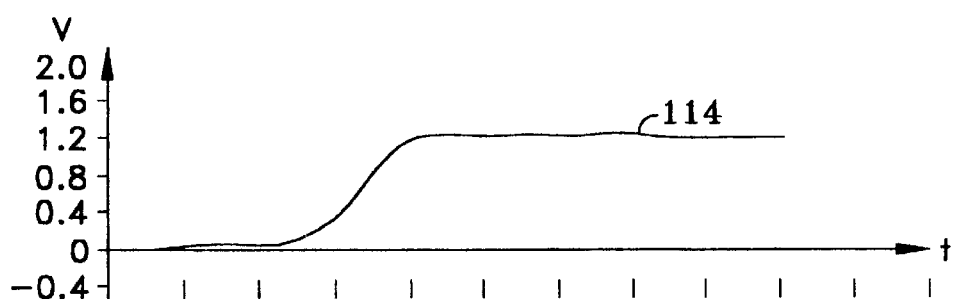

FIGS. 8–11, all drawn on same voltage and time scales show signals during the write operation. Timing for the wordline activating signal 100, local bitswitch signal 102, and sense amplifier set signal 104 are as shown in FIG. 8. FIG. 9 shows voltages at true bitline 106, reference bitline 108 and true fan node 110, respectively. The VWRITE voltage 112 is shown in FIG. 10 and the voltage 114 at the memory cell being written in FIG. 11.

With reference to FIGS. 3–7, a read operation to a memory cell numbered "1" within a group 50 begins with signals in the following initial conditions, BW high, all BXPs and LBXPs including BXP1 and LBXP1 low, LBWRITEP low, WRPREC low, LBRESTN high, LBREADP low, and SREADP low. The read operation is begun by precharging fan nodes FT and FC to Vdd by the signal LBRESTN going low to turn on read precharge devices 66. The READ signal disables low impedance voltage divider 70 for VWRITE. LBRESTN goes high again after precharging.

The wordline is activated and a small voltage difference signal develops between true and reference bitlines at a primary sense amplifier within a group 50. Local bitswitches remain low because output of global bitswitch signal generator (FIG. 6) remains disabled by the READ signal and the disabled sense amplifier set signal. Next, the sense amplifier set signal is enabled which amplifies the small voltage signal between true and reference bitlines to predetermined high and low voltages, on all of the bitlines in each group 50 connected to the activated wordline. A local bitswitch pair in the group, for example LBXP2, also turns on at this time with the enabling of a global bitswitch BXP2, thereby permitting the amplified logic levels on true and reference bitlines to be tranferred to the true and complement fan nodes FT and FC. Signal SREADP at local buffer 60 causes cross-coupled devices 68 to regenerate and maintain predetermined high and low voltage logic levels on fan nodes FT and FC. Finally, at an appropriate time, LBREADP gates the datum read from the memory cell onto an output bus PDOT.

Figure 12:
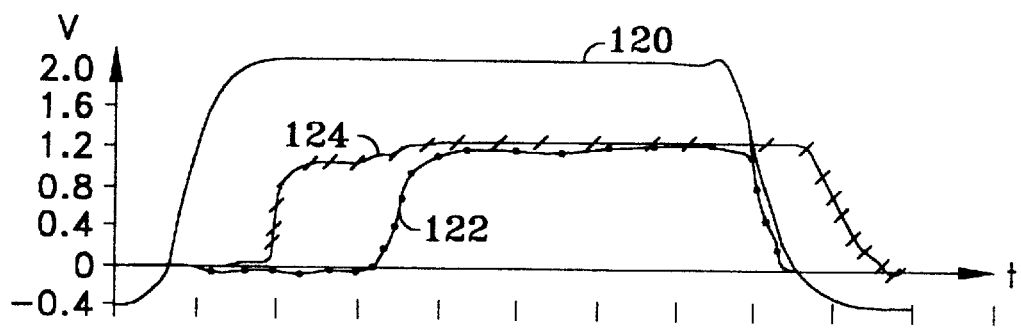
Figure 13:
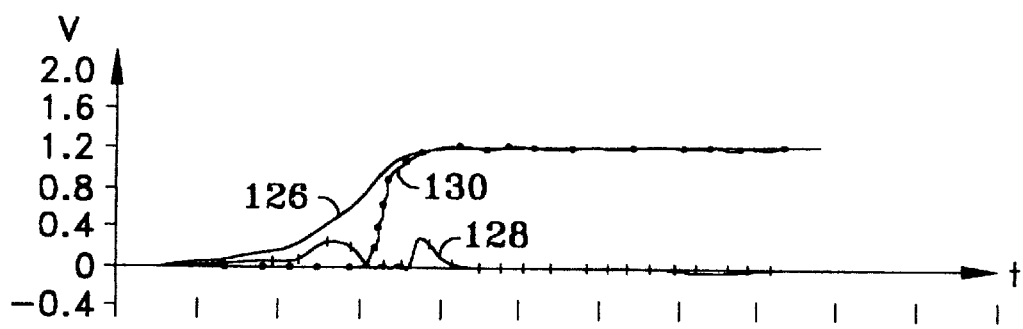
Figure 14:
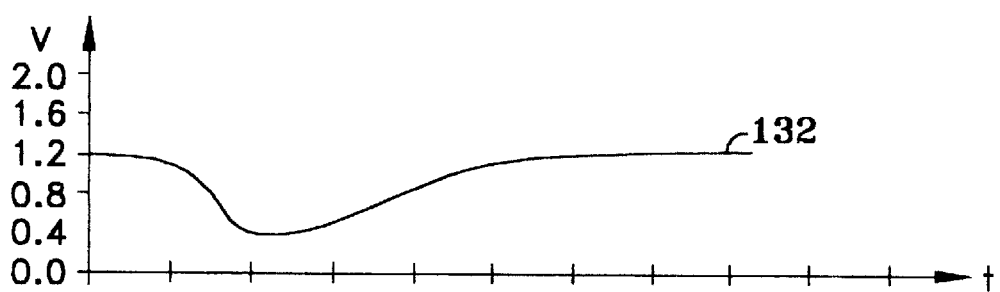

FIGS. 12–14, all drawn on the same voltage and time scales, show signals during the read operation. Timing for the wordline activating signal 120, local bitswitch signal 122, and sense amplifier set signal 124 are as shown in FIG. 12. FIG. 13 shows voltages at true bitline 126, reference bitline 128 and true fan node 130, respectively. The voltage 132 at the memory cell being read is shown in FIG. 14.

While the invention has been described with reference to certain preferred embodiments thereof, those skilled in the art will understand the many modifications and enhancements which can be made without departing from the true scope and spirit of the invention as claimed in the appended claims.

We claim:

1. An integrated circuit of the type including a memory having a memory array, the memory array including a memory cell having a true bitline coupled thereto, and a reference bitline, and further including a sense amplifier coupled to said true bitline and to said reference bitline, said sense amplifier adapted to amplify a small voltage difference between said true bitline and said reference bitline to a predetermined high voltage and a predetermined low voltage for transfer to and from said memory cell, the difference between said predetermined high voltage and said predetermined low voltage being much greater than said small voltage difference, said integrated circuit further comprising:

first and second bitswitches adapted to apply selected first and second write voltages having said small voltage difference to said true bitline and to said reference bitline, respectively, prior to amplification by said sense amplifier during a write operation, whereby said sense amplifier amplifies said small voltage difference to said predetermined high voltage and said predetermined low voltage, a different voltage to each of said true bitline and said reference bitline, to write a datum to said memory cell.

2. The integrated circuit of claim 1 wherein, during a read operation, said first and said second bitswitches are further adapted to isolate said true bitline and said reference bitline prior to amplification by said sense amplifier.

3. The integrated circuit of claim 2 further comprising a true fan node and a complement fan node, said true fan node and said complement fan node selectively coupled to said true bitline and said reference bitline by said first bitswitch and said second bitswitch, respectively, to store a datum read from or to be written to said memory cell, wherein said first and said second write voltages are applied to said true bitline and said reference bitline through said true fan node and said complement fan node, respectively.

4. The integrated circuit of claim 3 further comprising a pair of precharge switches selectively coupling said true fan node and said complement fan node to ground during a precharge operation prior to a write operation.

5. The integrated circuit of claim 3 further comprising write voltage circuitry coupled to said true fan node and said complement fan node, said write voltage circuitry during said write operation being adapted to gate a fixed nonzero voltage onto a selected one of said true fan node and said complement fan node, while grounding a nonselected one thereof, said selected one being selected based on a value of a datum to be written to said memory cell.

6. The integrated circuit of claim 5 wherein said write voltage circuitry includes interlock logic, said interlock logic preventing said fixed nonzero voltage from being gated onto said selected one while said sense amplifier is set.

7. The integrated circuit of claim 3 further comprising a pair of cross-coupled devices attached to said true fan node and said complement fan node, said cross-coupled devices responsive during only said read operation, to hold said true fan node and said complement fan node at different ones of said predetermined high voltage and said predetermined low voltage.

8. The integrated circuit of claim 3 further comprising bitswitch control logic, said bitswitch control logic responsive to a read signal, a bitswitch address signal, a sense amplifier set signal, and a reference wordline signal to time opening and closing of said first bitswitch and said second bitswitch, timing being different during said write operation and during said read operation.

9. The integrated circuit of claim 2, said memory cell being a first memory cell, said sense amplifier being a first sense amplifier, said true bitline being a first true bitline, said reference bitline being a first reference bitline, said memory array further including a second memory cell, a wordline coupled to said first and to said second memory cells, a second true bitline coupled to said second memory cell, and a second reference bitline, a second sense amplifier coupled to said second true bitline and to said second reference bitline, and third and fourth bitswitches coupled to said second true bitline and to said second reference bitline, respectively, wherein said first and said second bitswitches apply said first and said second write voltages to said first true bitline and to said first reference bitline, respectively, prior to amplification by said first sense amplifier during a write operation at the same time that said third and said fourth bitswitches isolate said second true bitline and said second reference bitline, whereby said write datum is written to said first memory cell in the same operation that a stored datum stored in said second memory cell is refreshed.

10. The integrated circuit of claim 9 further comprising a true fan node and a complement fan node, said true fan node and said complement fan node selectively coupled to said true bitline and said reference bitline by said first bitswitch and said second bitswitch, respectively, to store a datum read from or to be written to said memory cell, wherein said first and said second write voltages are applied to said true bitline and said reference bitline through said true fan node and said complement fan node, respectively.

11. The integrated circuit of claim 10 further comprising a pair of precharge switches selectively coupling said true fan node and said complement fan node to ground, whereby, during a precharge operation said true fan node and said complement fan node are grounded.

12. The integrated circuit of claim 11 further comprising write voltage circuitry coupled to said true fan node and said complement fan node, said write voltage circuitry during said write operation being adapted to gate a fixed nonzero voltage onto a selected one of said true fan node and said complement fan node, while grounding a nonselected one thereof, said selected one being selected based on a value of a datum to be written to said memory cell.

13. The integrated circuit of claim 12 wherein said write voltage circuitry includes interlock logic, said interlock logic preventing said fixed nonzero voltage from being gated onto said selected one of said true fan node and said complement fan node while said sense amplifier is set.

14. The integrated circuit of claim 13 further comprising a pair of cross-coupled devices coupled to said true fan node and said complement fan node, said cross-coupled devices responsive during only said read operation, to hold said true fan node and said complement fan node at different ones of said predetermined high voltage and said predetermined low voltage.

15. The integrated circuit of claim 10 further comprising bitswitch control logic, said bitswitch control logic responsive to a read signal, a bitswitch address signal, a sense amplifier set signal, and a reference wordline signal to open and close said first bitswitch and said second bitswitch at different times during said write operation and said read operation, respectively.

16. In an integrated circuit, a method of writing a datum to a memory cell of a memory array, said memory cell storing a datum accessed by a wordline and a true bitline coupled to said memory cell, said memory cell coupled to a sense amplifier by said true bitline, said sense amplifier adapted to differentiate a small voltage signal between said true bitline and a reference bitline to a full swing signal being a predetermined high voltage on one of said true bitline and said reference bitline and a predetermined low voltage on another one of said true bitline and said reference bitline, said small voltage signal having much smaller signal swing than said full swing signal, said method comprising:

activating said wordline, such that a small voltage signal appears on said true bitline and said reference bitline; prior to setting said sense amplifier to differentiate said small voltage signal, and responsive to write input, injecting a nonzero small voltage write signal onto said true bitline and said reference bitline; and thereafter setting said sense amplifier, whereby a datum is written to said memory cell, said datum having a value according to a polarity of said small voltage write signal.

17. The method of claim 16 further comprising, after activating said wordline and responsive to read input, isolating said true bitline and said reference bitline and thereafter setting said sense amplifier, such that a stored datum is read from said true bitline and said reference bitline after said sense amplifier is set.

18. The method of claim 17 further comprising coupling said true bitline and said reference bitline to a true fan node and a complement fan node by first and second bitswitches, respectively, wherein said small voltage write signal is applied through said first and said second bitswitches to said true bitline and said reference bitline from said true fan node and said complement fan node, respectively.

19. The method of claim 18 further comprising, when said datum is to be written, precharging said true fan node and said complement fan node to ground prior to activating said wordline.

20. The method of claim 19 further comprising preventing said small voltage write signal from being injected onto said true fan node and said reference fan node after setting said sense amplifier.

21. The method of claim 20 further comprising holding said true fan node and said complement fan node at different ones of said predetermined high voltage and said predetermined low voltage.

22. The method of claim 16 wherein said memory array further comprises a second memory cell, said second memory cell storing a datum accessed by said wordline and a second true bitline coupled to said second memory cell, said second memory cell coupled to a second sense amplifier by said second true bitline, said second sense amplifier adapted to differentiate a small voltage signal between said second true bitline and a second reference bitline to a full swing signal being a predetermined high voltage on one of said second true bitline and said second reference bitline and a predetermined low voltage on another one of said second true bitline and said second reference bitline, said small voltage signal having much smaller signal swing than said full swing signal, said method further comprising:

after activating said wordline, isolating said second true bitline and said second reference bitline, and thereafter setting said second sense amplifier simultaneously with said first sense amplifier, such that a stored datum stored in said second memory cell is refreshed while said datum is written to said first memory cell.

* * * * *